United States Patent
Imazu et al.

(10) Patent No.: US 8,282,416 B2
(45) Date of Patent: Oct. 9, 2012

(54) MOUNTING BOARD CONNECTOR WITH REINFORCING PLATE

(75) Inventors: Toshiyuki Imazu, Kanagawa (JP); Hitoshi Suzuki, Kanagawa (JP)

(73) Assignee: Iriso Electronics Co., Ltd., Kanagawa (JP)

( * ) Notice: Subject to any disclaimer, the term of this patent is extended or adjusted under 35 U.S.C. 154(b) by 0 days.

(21) Appl. No.: 13/059,677

(22) PCT Filed: Aug. 22, 2008

(86) PCT No.: PCT/JP2008/065000
§ 371 (c)(1),
(2), (4) Date: Mar. 18, 2011

(87) PCT Pub. No.: WO2010/021055
PCT Pub. Date: Feb. 25, 2010

(65) Prior Publication Data
US 2011/0159738 A1      Jun. 30, 2011

(51) Int. Cl.
*H01R 13/648* (2006.01)
(52) U.S. Cl. .................................................. 439/607.04
(58) Field of Classification Search ............. 439/607.04, 439/607.07, 607.09, 607.13, 607.2, 607.3, 439/607.32, 620.06, 620.12, 620.15, 620.16, 439/289, 79
See application file for complete search history.

(56) References Cited

U.S. PATENT DOCUMENTS 6,383,010 B1 * 5/2002 Mayo et al. .................... 439/357
6,506,065 B1 * 1/2003 Castleman .................... 439/157

FOREIGN PATENT DOCUMENTS

| JP | 51-6482 | 1/1976 |
|---|---|---|
| JP | 51-94945 | 7/1976 |
| JP | 4-136884 | 12/1992 |
| JP | 05-66881 | 9/1993 |
| JP | 6-60067 | 8/1994 |
| JP | 2003-331993 | 11/2003 |
| JP | 2007-059095 | 3/2007 |
| JP | 2007-294228 | 11/2007 |

* cited by examiner

*Primary Examiner* — Tulsidas C Patel
*Assistant Examiner* — Phuongchi Nguyen
(74) *Attorney, Agent, or Firm* — Lowe Hauptman Ham & Berner, LLP

(57) ABSTRACT

A reinforcing plate fixed to a connector main body is arranged on a bottom surface of the connector main body to come into surface contact with a surface of a substrate while a plurality of holes is provided on a surface, which contacts the substrate, of the reinforcing plate. When the reinforcing plate is soldered to the substrate, therefore, a solder wraps around not only a peripheral edge of the reinforcing plate but also an edge of each of the holes so that a soldering portion between the reinforcing plate and the substrate can be sufficiently ensured.

8 Claims, 2 Drawing Sheets

MOUNTING BOARD CONNECTOR WITH REINFORCING PLATE

RELATED APPLICATION

The present application is based on, and claims priority from, PCT Application Number PCT/JP08/065,000, filed Aug. 22, 2008, the contents of which is hereby incorporated by reference herein in its entirety.

TECHNICAL FIELD

The present invention relates to a connector that is mounted on a printed circuit board when used.

BACKGROUND ART

Conventionally, known as this type of connector has been one including an insulating connector main body, one end of which is opened, a plurality of conductive terminals held in the connector main body, and a reinforcing plate fixed to the connector main body, and so adapted that each of the terminals and the reinforcing plate are soldered to a substrate (see, e.g., Patent Document 1).

In this connector, a counterpart connector is inserted into an opening at the one end of the connector main body so that a terminal of the counterpart connector contacts each of the terminals in the connector main body. Therefore, the connector is connected to the counterpart connector.

However, in the connector, a great load caused by insertion and removal of the counterpart connector is applied thereto. Therefore, a crack may easily occur in a soldering portion of the reinforcing plate, and soldering strength of the reinforcing plate cannot be sufficiently ensured.

Patent Document 1: Japanese Utility Model Publication 5-66881

DISCLOSURE OF THE INVENTION

Problems to be Solved by the Invention

The present invention has been made in view of the above described problems, and an object thereof is to provide a connector capable of improving soldering strength of a reinforcing plate.

Means for Solving the Problems

In order to attain the above-mentioned object, in a connector including an insulating connector main body, one end of which is opened, a plurality of terminals held in the connector main body, and a reinforcing plate fixed to the connector main body, and so adapted that each of the terminals and the reinforcing plate are soldered to a substrate, the reinforcing plate is arranged on a bottom surface of the connector main body to come into surface contact with a surface of the substrate, and a plurality of holes is provided on a surface, which contacts the substrate, of the reinforcing plate.

When the reinforcing plate is thus soldered to the substrate, a solder wraps around not only a peripheral edge of the reinforcing plate but also an edge of each of the holes so that a soldering portion between the reinforcing plate and the substrate can be sufficiently ensured.

Advantages of the Invention

According to the present invention, a soldering portion between a reinforcing plate and a substrate can be sufficiently ensured. This enables an improvement in soldering strength of the reinforcing plate and enables mounting strength on the substrate to be enhanced for insertion and removal of a counterpart connector. By providing each of the holes, the reinforcing plate can be made lightweight, and heat transfer at the time of soldering can also be improved.

DESCRIPTION OF SYMBOLS

10 denotes a connector main body, 20 denotes a terminal, 30 denotes a reinforcing plate, 31 denotes a hole, 34 denotes an engagement piece, 40 denotes a substrate, and 41 denotes a mounting hole.

BEST MODE FOR CARRYING OUT THE INVENTION

Figure 1:
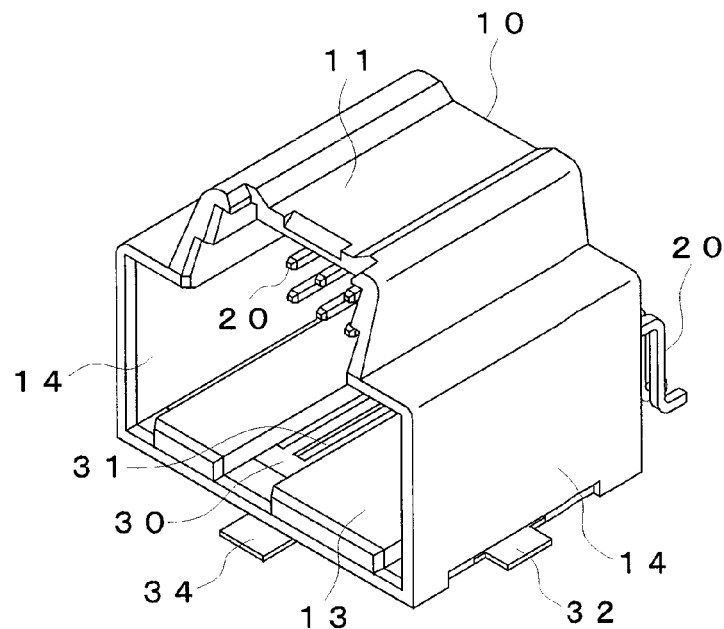
FIG. 1 is a perspective view on the side of an upper surface of a connector according to an embodiment of the present invention.
Figure 2:
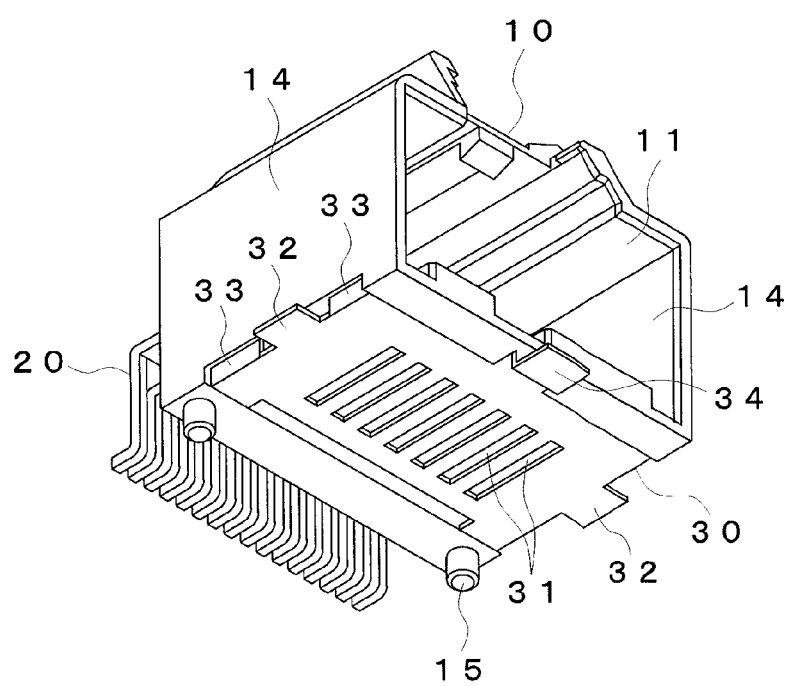
FIG. 2 is a perspective view on the side of a bottom surface of the connector.
Figure 3:
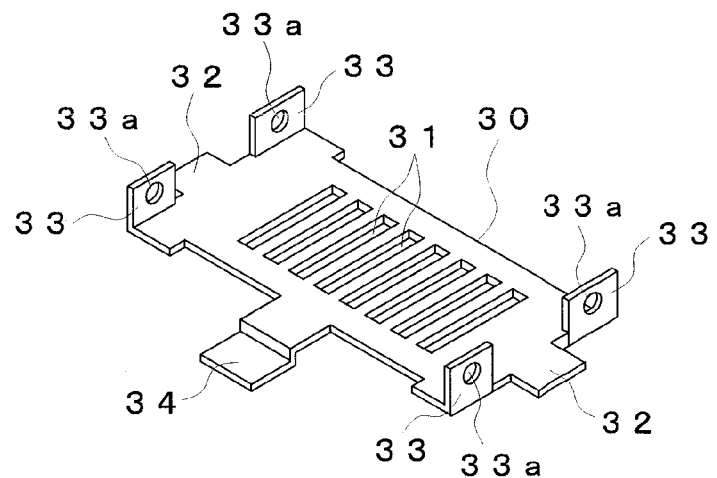
FIG. 3 is a perspective view of a reinforcing plate.
Figure 4:
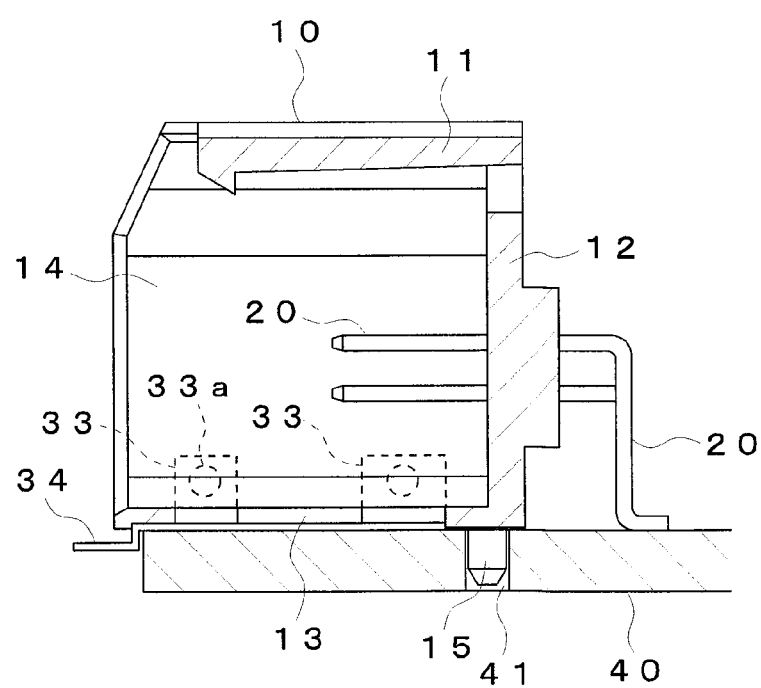
FIG. 4 is a side sectional view illustrating the connector in a mounted state on a substrate.

FIGS. 1 to 4 illustrate an embodiment of the present invention. A connector illustrated in the figures includes an insulating connector main body 10, one end of which is opened, a plurality of terminals 20 spaced apart from one another in its width direction and held in the connector main body 10, and a reinforcing plate 30 fixed to the connector main body 10, and is mounted on a substrate 40 when used.

The connector main body 10 is formed of a molded product made of synthetic resin, and has a hollow shape, one end of which is opened. The connector main body 10 includes an upper surface wall 11, a rear surface wall 12, a lower surface wall 13, and right and left side surface walls 14, and a counterpart connector (not illustrated) such as a plug connector is made to be inserted into an opening at the one end. A plurality of projections 15 projecting downward is provided on a lower surface of the connector main body 20, and the projections 15 engage with a plurality of mounting holes 41 provided in the substrate 40.

Each of the terminals 20 is formed of a metallic pin having conductivity, and has a substantially L shape. Each of the terminals 20 is arranged in upper and lower columns within the connector main body 10, and one end of each of the terminals 20 is arranged on the side of the opening at the one end of the connector main body 10. The other end of each of the terminals 20 extends outward after penetrating the rear surface wall 12 of the connector main body 10 while bending in a substantially L shape and extending downward from a rear surface of the connector main body 10.

The reinforcing plate 30 is formed of a metal plate having a substantially square shape arranged on the lower surface of the connector main body 10 to come into surface contact with a surface of the substrate 40, and is formed integrally with the connector main body 10 by insert molding. The reinforcing plate 30 is provided with holes 31 composed of a plurality of slits extending in a back-and-forth direction, and the holes 31 are spaced apart from one another and arranged in a width direction of the reinforcing plate 30. Projection pieces 32 extending outward in the width direction of the reinforcing plate 30 are respectively provided at both ends in the width direction. Fixed pieces 33 extending upward are respectively provided ahead of and behind each of the projection pieces 32, and are embedded in each of the side surface walls 14 of the connector main body 10 at the time of insert molding. The fixed pieces 33 fix the reinforcing plate 30 to the connector main body 10. In this case, each of the fixed pieces 33 is provided with circular through holes 33a. Each of the through holes 33a enhances integration of the fixed piece 33 with the connector main body 10 by insert molding. An engagement piece 34 projecting forward is provided at a front end of the reinforcing plate 30, and the engagement piece 34 is inserted into an engagement hole (not illustrated) in the counterpart connector.

The connector configured as described above is mounted on the substrate 40 by respectively engaging the projections 15 in the connector main body 10 with the mounting holes 41 in the substrate 40 and soldering the other end of each of the terminals 20 and the reinforcing plate 30 to the substrate 40. In the case, a solder wraps around not only a peripheral edge of the reinforcing plate 30 but also an edge of each of the holes 31 so that a soldering portion between the reinforcing plate 30 and the substrate 40 is sufficiently ensured.

In the connector according to the present embodiment, the reinforcing plate 30 fixed to the connector main body 10 is arranged on a bottom surface of the connector main body 10 to come into surface contact with the surface of the substrate 40 while a plurality of the holes 31 are provided on a surface of the reinforcing plate 30 which contacts the substrate 40. When the reinforcing plate 30 is soldered to the substrate 40, therefore, a solder wraps around not only the peripheral edge of the reinforcing plate 30 but also the edge of each of the holes 31 so that the soldering portion between the reinforcing plate 30 and the substrate 40 can be sufficiently ensured. This enables an improvement in soldering strength of the reinforcing plate 30, and enables mounting strength on the substrate 40 to be enhanced for insertion and removal of the counterpart connector. By providing each of the holes 31, the reinforcing plate 30 can be made lightweight, and heat transfer at the time of soldering can also be improved.

In this case, the holes 31 in the reinforcing plate 30 are formed of the plurality of slits arranged in the width direction. Therefore, the length of the edge of each of the holes 31 can be sufficiently ensured, which is significantly advantageous to improve the soldering strength.

The connector main body 10 is provided with a plurality of the projections 15 that engage with the holes 41 provided in the substrate 40. Therefore, an engagement between the projections 15 and the holes 41 enables movement of the connector main body 10 to be regulated in directions of insertion and removal of the counterpart connector, thereby enabling the mounting strength on the substrate 40 to be more greatly enhanced.

Furthermore, the reinforcing plate 30 is provided with the engagement piece 34 that engages with the counterpart connector. Therefore, the reinforcing plate 30 can regulate movement of the counterpart connector, and a force applied from the counterpart connector at the time of insertion and removal can be reduced.

The reinforcing plate 30 is formed integrally with the connector main body 10 by insert molding. This enables the reinforcing plate 30 to be firmly fixed to the connector main body 10 while eliminating the need for a process for mounting the reinforcing plate 30 on the connector main body 10, thereby also enabling an improvement in productivity.

The invention claimed is:

1. A connector comprising an insulating connector main body, one end of which is opened, a plurality of terminals held in the connector main body, and a reinforcing plate fixed to the connector main body, and so adapted that each of the terminals and the reinforcing plate are soldered to a substrate,
   wherein the reinforcing plate is arranged on a bottom surface of the connector main body to come into surface contact with a surface of the substrate, and a plurality of holes formed in a surface of the reinforcing plate which contacts the substrate,
   wherein each hole of the plurality of holes in the reinforcing plate is a slit arranged in a width direction thereof,
   wherein the slits are adjacent to each other in the width direction at a central area of the reinforcing plate and elongated in a length direction perpendicular to the width direction, and an edge of each of the slits is adapted to be surrounded by solder.

2. The connector according to claim 1, wherein the connector main body is provided with a projection configured to engage with a hole provided in the substrate.

3. The connector according to claim 1, wherein the reinforcing plate is provided with an engagement portion at a front end of the reinforcing plate and projecting forward of a front surface of the connector main body configured to engage with a counterpart connector.

4. The connector according to claim 1, wherein the reinforcing plate is formed integrally with the connector main body by insert molding.

5. The connector reinforcing plate according to claim 1, wherein the plurality of slits extend in the width direction of the reinforcing plate.

6. The connector according to claim 1, wherein the holes are formed on a side surface wall of the reinforcing plate.

7. The connector according to claim 6, wherein the holes are circular.

8. The connector according to claim 6, wherein the side surface wall extends perpendicular to the upper surface of the reinforcing plate and the holes are formed perpendicular to the upper surface of the reinforcing plate.

* * * * *